(12) United States Patent
Park et al.

(10) Patent No.: US 7,078,292 B2
(45) Date of Patent: Jul. 18, 2006

(54) STORAGE NODE CONTACT FORMING METHOD AND STRUCTURE FOR USE IN SEMICONDUCTOR MEMORY

(75) Inventors: Je-Min Park, Gyeonggi-do (KR); Yoo-Sang Hwang, Gyeonggi-do (KR); Cheol-Ju Yun, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/875,004

(22) Filed: Jun. 22, 2004

(65) Prior Publication Data

US 2004/0266101 A1 Dec. 30, 2004

(30) Foreign Application Priority Data

Jun. 27, 2003 (KR) ...................... 10-2003-0042637

(51) Int. Cl.
*H01L 21/8242* (2006.01)

(52) U.S. Cl. ............... 438/250; 438/254; 257/E21.647; 257/E21.648; 257/E21.649

(58) Field of Classification Search ................ 438/250, 438/253, 254; 257/E21.647, E21.648, E21.649
See application file for complete search history.

(56) References Cited

U.S. PATENT DOCUMENTS

| 5,627,095 | A | * | 5/1997 | Koh et al. | 438/672 |
| 6,177,307 | B1 | | 1/2001 | Tu et al. | |
| 6,528,368 | B1 | | 3/2003 | Park | |
| 6,534,813 | B1 | * | 3/2003 | Park et al. | 257/300 |
| 2004/0075156 | A1 | * | 4/2004 | Lee et al. | 257/503 |
| 2004/0127050 | A1 | * | 7/2004 | Park et al. | 438/692 |
| 2004/0178433 | A1 | * | 9/2004 | Yun et al. | 257/298 |

* cited by examiner

*Primary Examiner*—Trung Dang
(74) *Attorney, Agent, or Firm*—Marger Johnson & McCollom, P.C.

(57) ABSTRACT

A storage node contact forming method and structure reduces the number of processes required by the conventional art and increases a critical dimension of a storage node to prevent a leaning phenomenon and reduce a manufacturing cost of semiconductor memory devices. The method includes preparing a semiconductor substrate that involves at least one contact pad contacted with an active region of a memory cell transistor through an insulation layer. The method also includes forming a storage node contact of T-shape, the storage node contact being composed of a lower region contacted with an upper part of the contact pad, and an upper region that is extended to a gate length direction of the memory cell transistor and that is formed as a size larger than a size of the lower region, in order to electrically connect the contact pad with a storage node to be formed in a later process.

24 Claims, 14 Drawing Sheets

STORAGE NODE CONTACT FORMING METHOD AND STRUCTURE FOR USE IN SEMICONDUCTOR MEMORY

CROSS REFERENCE TO RELATED APPLICATIONS

This application claims priority from Korean Patent Application 2003-0042637, filed on Jun. 27, 2003, the contents of which are hereby incorporated by reference in their entirety.

BACKGROUND OF THE INVENTION

1. Field of the Invention

This disclosure relates to the manufacturing of semiconductor memory cells, and more particularly, to a method of forming a storage node contact for an electrical connection of a storage node in a semiconductor memory such as a dynamic random access memory (DRAM) etc.

2. Description of the Related Art

A memory cell of DRAM is generally constructed of one access transistor and one storage capacitor. The capacitor may be classified either as a laminated type or a trench type dependent on where it is formed on a semiconductor substrate.

Semiconductor manufacturers that employs the laminated-type capacitor have been exploring ways to produce capacitors having a higher capacitance in a limited area in conformity with various requirements of semiconductor users. This research is driven by the high integration density of memory cells that produces a tightened critical dimension (CD), thereby decreasing the capacitance. However, in order to guarantee a refresh operating period within a range of regulated values, the capacitance is required to increase within the limited area.

As the integration level of a semiconductor memory gradually increases, a pattern size of the capacitor generally composed of a storage node as a lower electrode node and a plate node as an upper electrode gradually decreases. Thus, a bottom critical dimension (CD) of the storage node becomes too small to maintain an original pattern in a manufacturing process, in other words, the storage node collapses due to a leaning phenomenon.

In order to prevent the leaning phenomenon, a conventional method includes forming a straight type storage node on a lower structure formed in the straight structure to increase the bottom CD of the storage node or to lower a height of the storage node. However, with the former method it is difficult to increase the bottom CD when a design rule is first decided, and with the latter method it is difficult to obtain a desired capacitance.

As an advanced method to provide a larger bottom CD and reduce an occurrence of the leaning phenomenon within a limited area, the first method described above was recently improved. During formation of the storage node, an active region, a gate, a bit line contact, a storage node contact or buried contact, and bit line patterns are formed in a diagonal direction offset at an angle compared to the existing straight structure. Thus, a storage node of a square type is formed. This improved method increases the bottom CD of the storage node as compared with the storage node of the existing straight type, and this is known in this field as a diagonal structure. However, while the diagonal structure may increase the CD of the storage node to ensure stability, there are severe complications involved in forming a storage node contact that is properly connected to the storage node.

In order to solve this problem with the diagonal structure, another method of forming a square type storage node that combines the advantages of the straight structure and the diagonal structure was proposed. In this method, the active region, gate, bit line, and storage node contact, etc., are formed by the existing straight structure. Then, entirely thereon, a buffer layer is formed, and a pad contact is formed on the buffer layer, to thus connect a storage node of square type with a storage node contact formed in the straight structure. It is known in manufacturing the storage node of the square type that the bottom CD of the square type storage node is about twice as large as the storage node of the straight type based on the straight structure.

A contact forming method for an electrical connection of square-type storage node in the prior art will be described referring to FIGS. 1 through 6, as follows, only to provide a thorough understanding of the invention that will be subsequently described.

FIG. 1 is a plan diagram illustrating a disposition relationship between a storage node of a square type capacitor and contacts connected with the storage node in a semiconductor memory according to the conventional art. FIGS. 2 to 6 are cross sectional diagrams illustrating sequential processes in manufacturing the contact for a connection of the storage node referred to FIG. 1.

Referring first to FIG. 1, six word line stacks 8 as gates of a plurality of access transistors are formed in a first direction, and four bit line stacks 20 connected to drains of the access transistors are formed in a direction perpendicular to the first direction. Square type storage nodes 32 of the capacitors extend in a diagonal direction to the bit line stacks 20 and the word line stacks 8, forming an oblong structure. Herewith, a storage node contact 22 and a storage node contact pad 12 are overlapped as shown by the cross-hatched region. The storage node contact 22 and the storage node contact pad 12, and its lower part structure are formed by a straight structure as afore-mentioned. Further, a pad contact 26 formed through the buffer layer is partially overlapped with a portion at which the storage node contact 22 is formed. In the meantime, a reference number 15 indicates a bit line contact for connecting a bit line with a drain, and reference numeral 14 designates a bit line contact pad. FIGS. 2 to 6 are drawings taken along the lines A–A' and B–B' shown in FIG. 1.

On the left side of FIGS. 2 through 6, sectional views taken along an A–A' cutting line direction of FIG. 1, namely, along a word line direction connected to a gate of an access transistor are each illustrated by a sequential process. On the right side of FIGS. 2 to 6, sectional views taken along a B–B' cutting line direction of FIG. 1, namely, along a bit line direction connected to a drain of the access transistor are illustrated by a sequential process.

FIG. 2 illustrates a structure before forming a storage node contact in a DRAM based on a capacitor over bit line (COB) structure. A device separate layer 4 is formed on a predetermined region of a semiconductor substrate 2 to define a plurality of active regions. A gate oxide layer 8a is formed on the active regions. Thereon, a plurality of parallel word line stacks 8 traversing the active regions are formed. The word line stack 8 contains a word line 8b and a capping layer 8c laminated sequentially. An impurity ion is implanted into the active regions by using the word line stack 8 and the device separate layer 4 as an ion implantation mask, to thus form impurity regions 6s, 6d. The active impurity regions 6d between one pair of word line stacks 8 traversing the respective active regions are pertinent to common drain regions of a DRAM cell transistor. Further, the impurity regions 6s formed on both sides of each common drain region 6d are pertinent to source regions of the DRAM cell transistor. A word line spacer 8d is formed on a sidewall of the gate oxide layer 8a and the word line stacks 8. A first insulation layer 10 is formed on a face of the semiconductor substrate containing the word line spacer 8d. The first insulation layer 10 is partially etched to form the bit line contact pad 14 connected with the common drain region 6d and the storage node contact pad 12 connected with the source region 6s. Then, a second insulation layer 16 is formed on a face of the semiconductor substrate containing the bit line contact pad 14 and the storage node contact pad 13. The second insulation layer 16 is patterned to form the bit line contact 15. Then, the plurality of bit line stacks 20, which are connected with the bit line contacts 15 and have each spacer 20d on its sidewall, are formed. The bit line stack 20 is formed traversing the word line stack 8. The bit line stack 20 involves a bit line 20b and a bit line capping layer 20c laminated sequentially. Each of the bit lines 20b is electrically connected to the bit line contact pad 14 through the bit line contact 15. The bit line spacer 20d is formed on a sidewall of the bit line 20b and the capping layer 20c. A third insulation layer 18 is formed equally to a height of an upper part of the bit line capping layer 20c, on an entire face of the semiconductor substrate 2 containing the bit line stack 20 and the bit line spacer 20d.

As shown in FIG. 3, the third insulation layer 18 and the second insulation layer 16 are continuously patterned to form the storage node contact 22 through a general method, so as to be connected to the storage node contact pad 12. Thus, the active regions 6s, 6d, the bit line contact pad 14, the storage node contact pad 13, the bit line stack 20, the word line stack 8, and the storage node contact 22 etc. constitute a straight lower structure.

As shown in FIG. 4, a buffer layer 24 is formed on the semiconductor substrate 2 having the storage node contact 22 was formed. The buffer layer 24 is formed with PE-TEOS (Plasma Enhanced Tetra Ethyl Ortho Silicate) material.

Referring to FIG. 5, a storage node of square type and a pad contact 26 for a connection with the node contact 22 are formed on the semiconductor substrate 2 having the buffer layer 24. The pad contact 26 is formed through procedures of forming an aperture through a photolithography process on the buffer layer 24, depositing the aperture with conductive material and then flattening it.

With reference to FIG. 6, an etch stop layer 28 and a molding oxide layer 30 are sequentially formed on the semiconductor substrate 2 having the pad contact 26, and thereon, an etch mask pattern is formed on the molding oxide layer 30. An opening part is formed to partially expose an upper part of the pad contact 26 connected with the storage node through an etch process. A CVD (Chemical Vapor Deposition) process is performed on an entire face of the semiconductor substrate, containing the opening part, to thus a conductive layer made of polysilicon. The conductive layer remained on the molding oxide layer is removed through a flattening process etc., to thus form the storage node 32 of the square type. The storage nodes of square type 32a through 32e each show a sectional face of the square type storage node shown in FIG. 1.

In the conventional processes described above, in order to form a storage node of square type on a semiconductor substrate based on a straight lower structure, a contact using a buffer layer is formed after forming the storage node contact. Thus, the storage node contact and the contact using the buffer layer, namely, two contacts, are formed between the storage node contact pad and the storage node that is connected from an upper part thereof. In other words, an additional procedure of forming a pad contact for connecting a storage node of square type and a storage node contact of straight structure with the buffer layer is required.

Furthermore, a critical photolithographic process should be accompanied with a contact forming process, thus a process margin is tight and an overall manufacturing process is relatively complicated and difficult.

Embodiments of the invention address these and other disadvantages of the conventional art.

SUMMARY OF THE INVENTION

Embodiments of the invention provide a storage node contact forming method and a resultant structure that reduces the number of processes required to form a semiconductor memory device. Embodiments of the invention provide a storage node contact forming method and a resultant structure in a semiconductor memory that prevents a storage node from collapsing in a process of forming the storage node. Still other embodiments of the invention provide a method of forming a storage node contact in forming a square-type storage node that promotes process stabilization and reduces a manufacturing cost of the semiconductor memory. Embodiments of the invention may also provide a structure for a storage node contact that increases a contact area with a storage node.

BRIEF DESCRIPTION OF THE DRAWINGS

The above and other features of exemplary embodiments of the invention will become readily apparent from the description that follows, with reference to the attached drawings.

DETAILED DESCRIPTION OF THE INVENTION

According to exemplary embodiments of the invention, a storage node contact forming method and a resultant structure will be described with reference to FIGS. 7 to 21.

It will be understood by those skilled in the art that the invention may be practiced numerous ways and is not limited to the following described embodiments. The following various embodiments are exemplary in nature.

Figure 1:
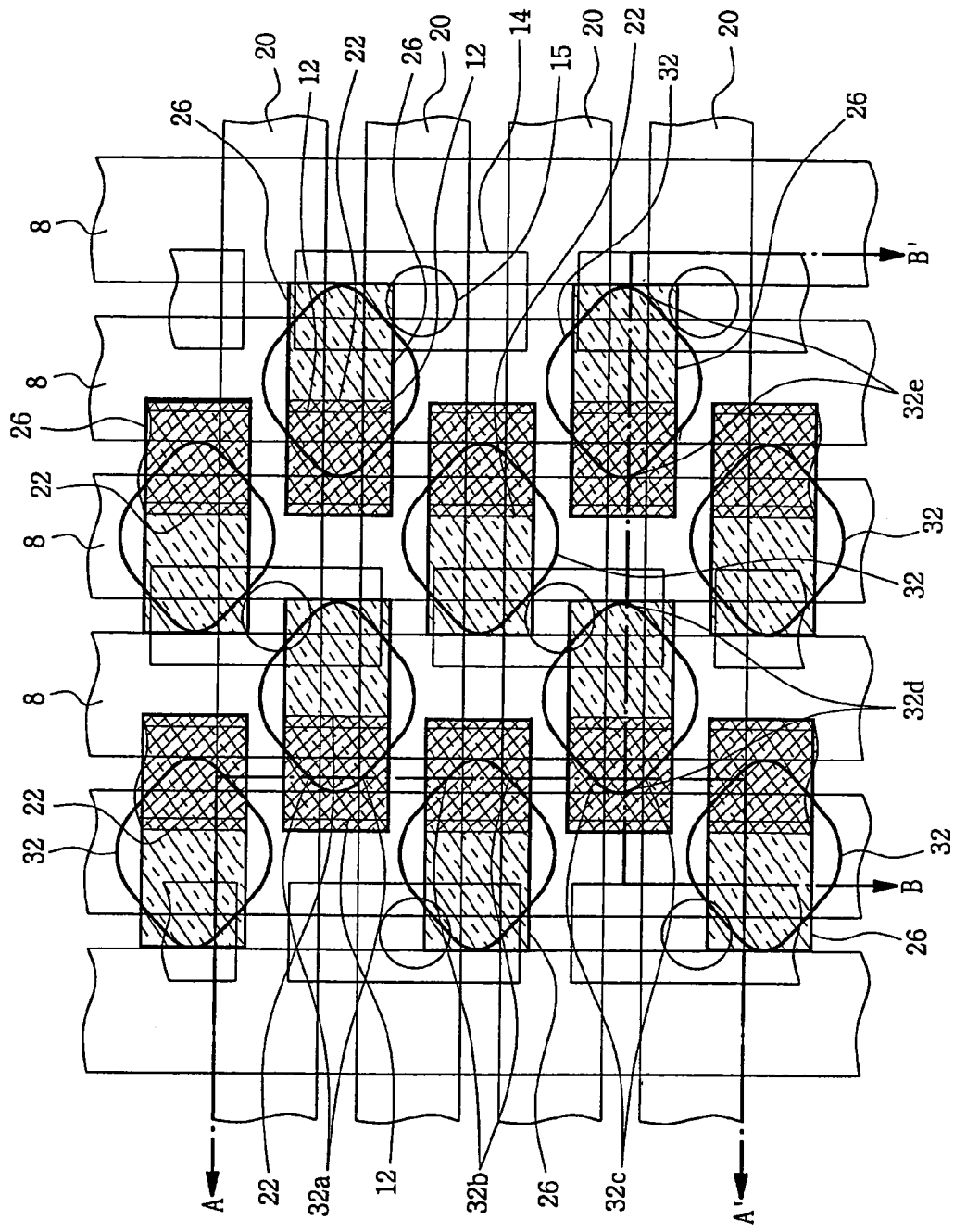
FIG. 1 is a plan view diagrams illustrating a disposition relationship between storage nodes and contacts connected to the storage nodes according to the conventional art.
Figure 2:
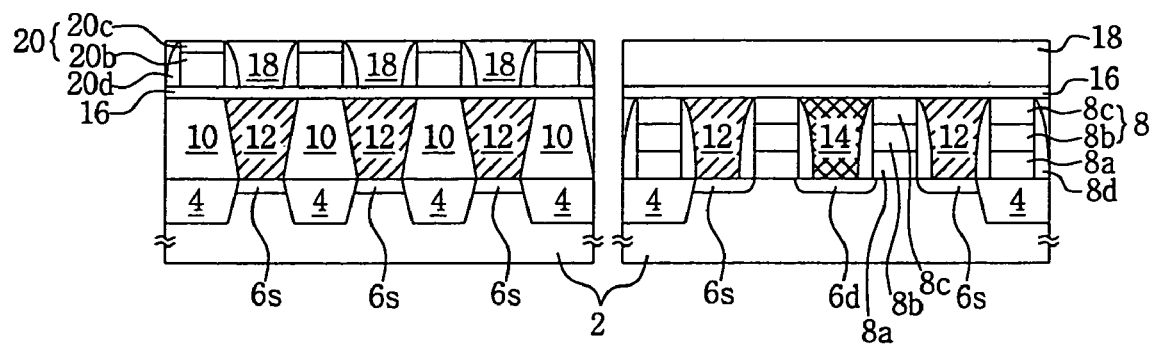
FIGS. 2 to 5 are cross-sectional diagrams illustrating sequential processes in forming contacts connected to storage nodes according to the conventional art.
Figure 3:
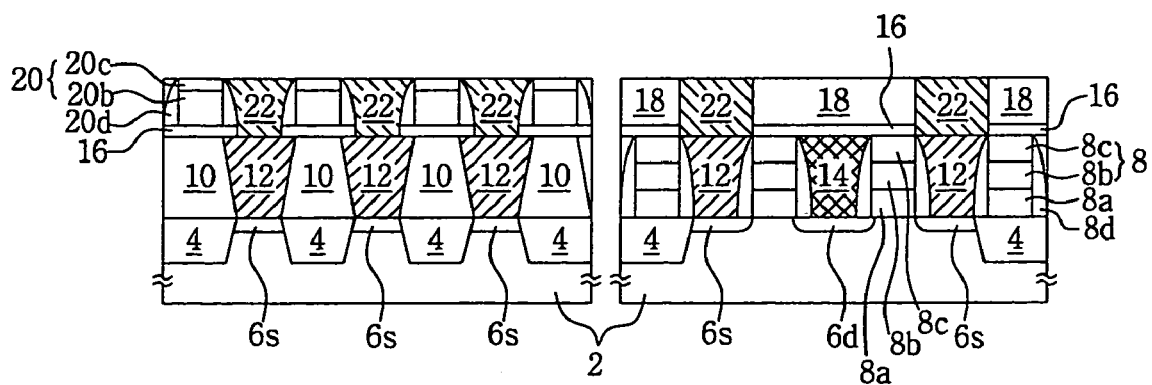
Figure 4:
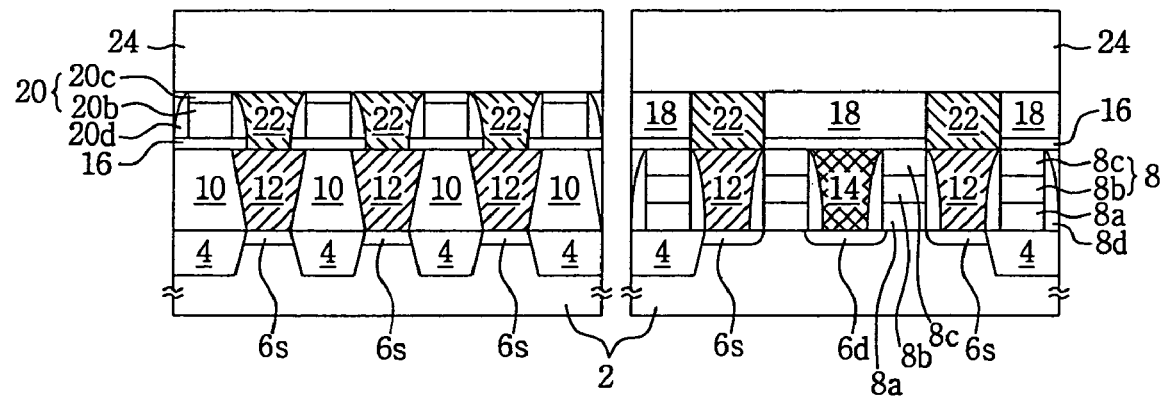
Figure 5:
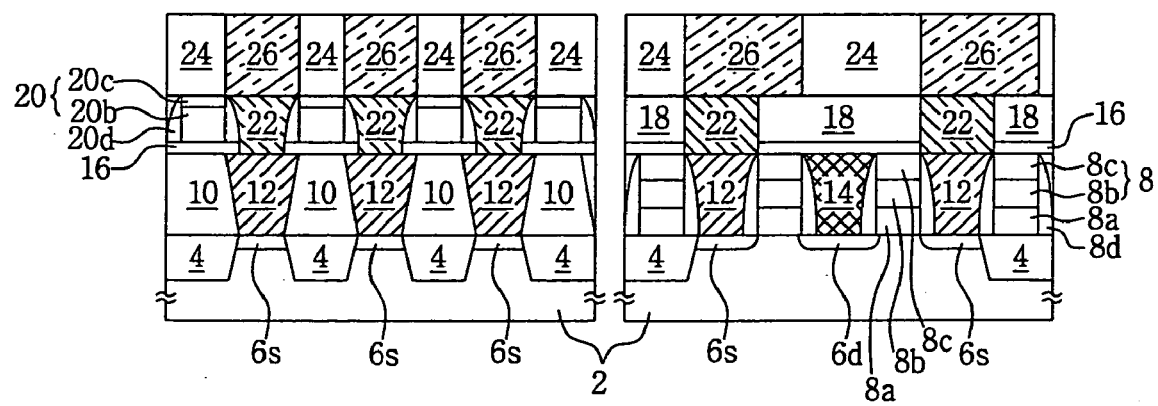
Figure 6:
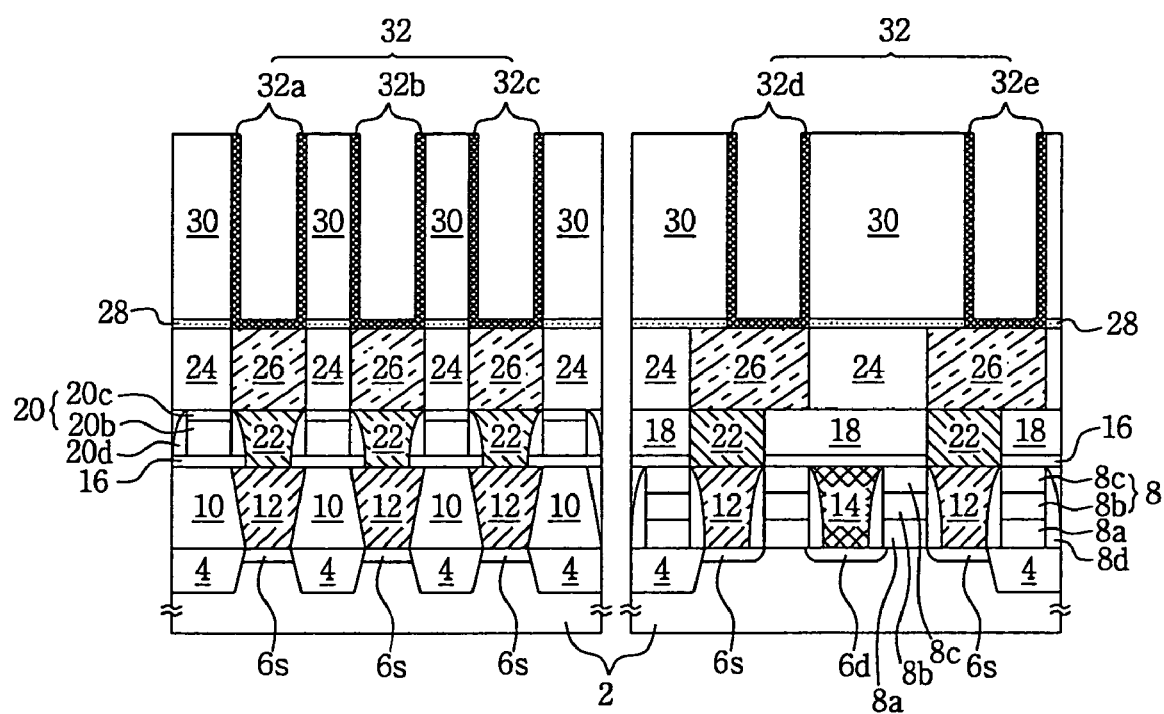
FIG. 6 is a cross-sectional diagram illustrating a storage node of square type contacted with the contact formed through the procedures of FIGS. 2 to 5.
Figure 7:
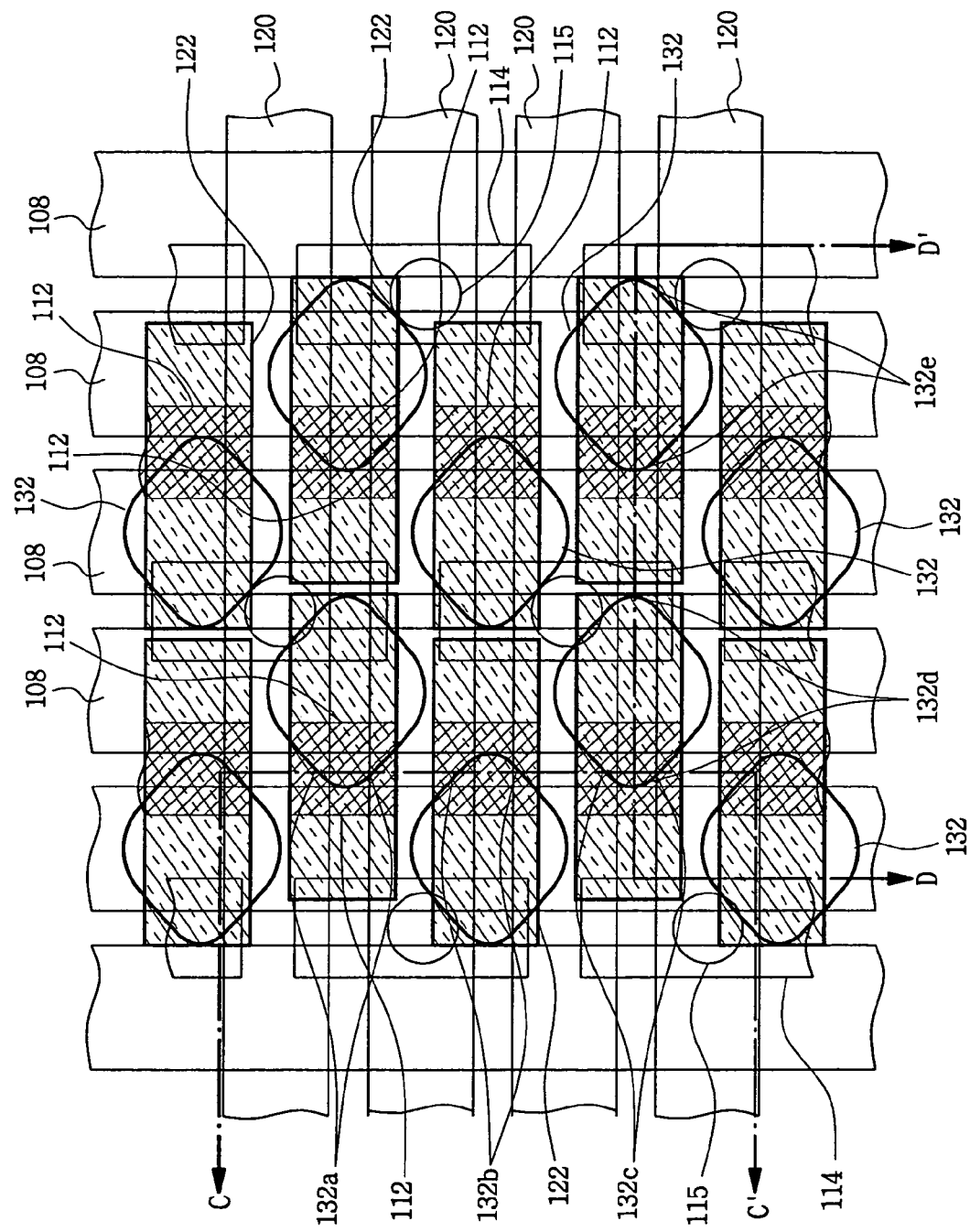
FIG. 7 is a plan view diagram illustrating a disposition relationship between storage nodes and storage node contacts according to an exemplary embodiment of the invention.
Figure 8:
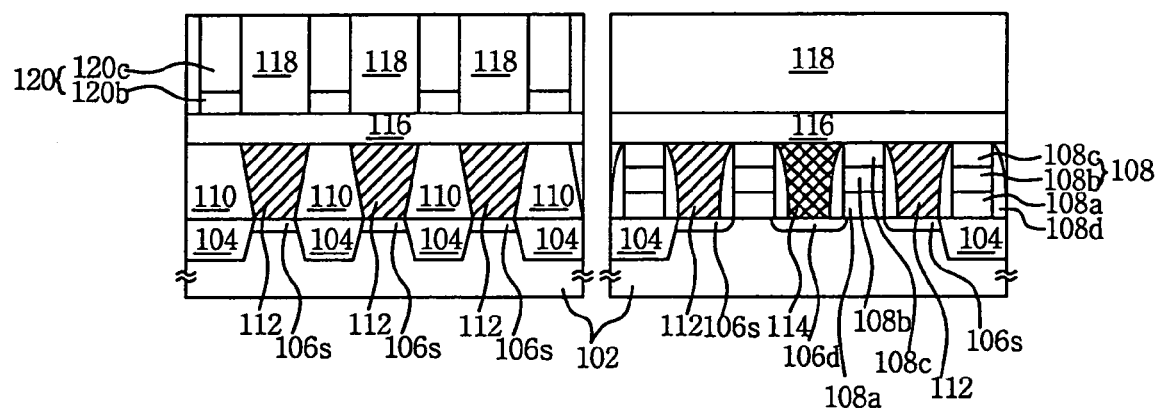
FIG. 8 and FIGS. 10–15 are cross sectional diagrams illustrating sequential manufacturing processes of a storage node contact according to an exemplary embodiment of the present invention.
Figure 9:
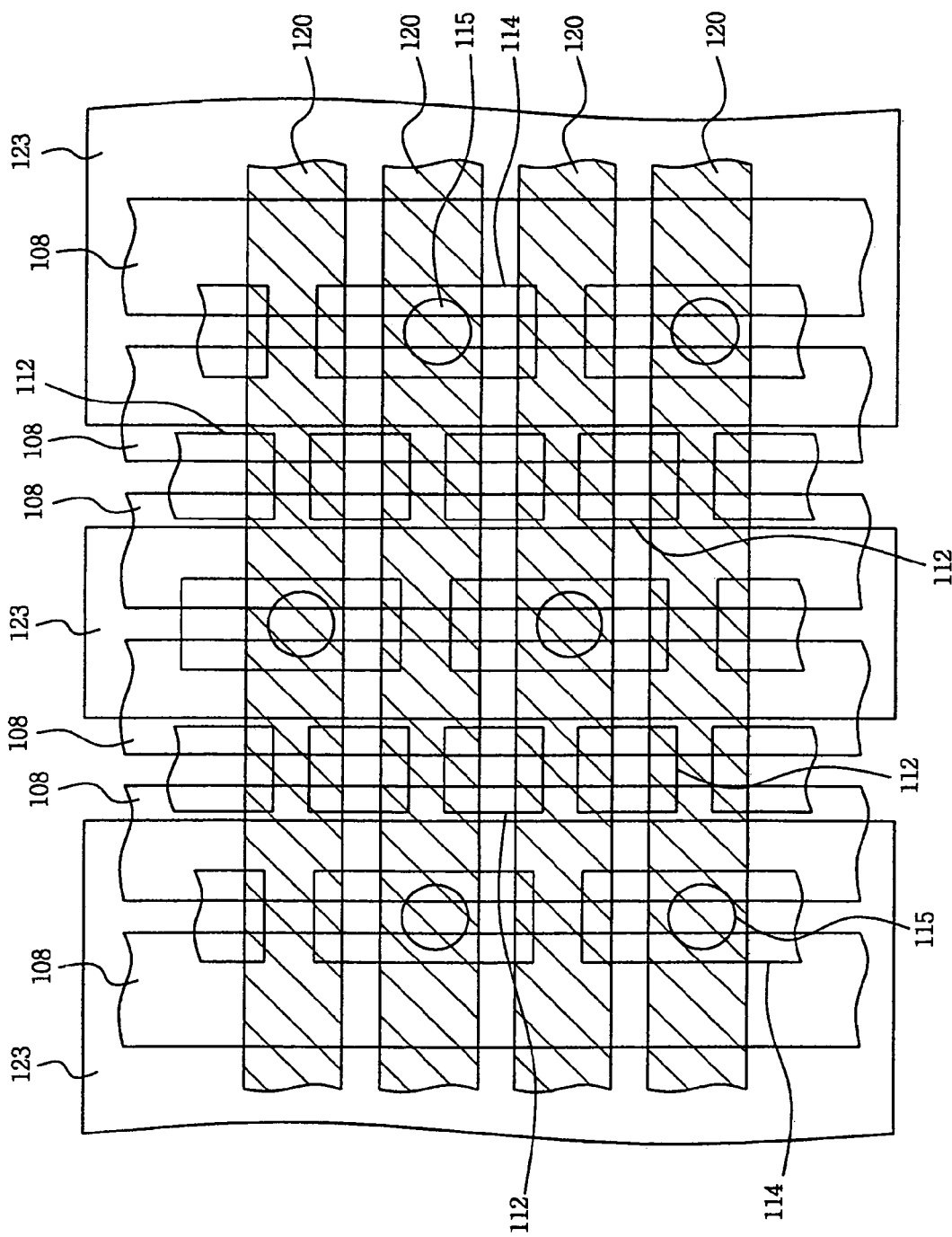
FIG. 9 is a layout plan view diagram illustrating forming a mask pattern of line type to form a storage node contact according to an exemplary embodiment of the present invention.

FIG. 7 is an enlarged plan diagram illustrating a disposition relationship between square-type storage nodes and storage node contacts according to an exemplary embodiment of the invention, and FIG. 9 is an enlarged plan diagram illustrating mask patterns of a line type. FIG. 8 and FIGS. 10 through 15 are cross-sectional diagram illustrating sequential processes in forming a storage node contact according to an exemplary embodiment of the invention. FIGS. 17 to 21 are cross-sectional diagram illustrating sequential processes performed after the processes of FIG. 10. FIG. 16 is a cross-sectional diagram illustrating formation of a storage node in a process performed after forming the storage node contact.

Referring first to FIG. 7, word line stacks 108 are illustrated vertically end are formed as gates of a plurality of access transistors. Further, four bit line stacks 120 are illustrated horizontally and are connected with drains of the access transistors. Square-type storage nodes 132 of a capacitor form an oblong structure in a direction diagonal to the bit line stack 120 and the word line stack 108. Herewith, a storage node contact 122 is partially overlapped with a storage node contact pad 112, to be long extended in a gate length direction. A lower part of the storage node 132 of square type is in contact with an upper portion of the storage node contact 122. A lower structure of the word line stack 108, the bit line stack 120, and the storage node contact pad 112, etc. is formed as a straight structure. A bit line contact 115 is used to connect a bit line and a bit line contact pad 114.

FIG. 7 illustrates a plan view according to one exemplary embodiment of the present invention, and on other plan view based on another exemplary embodiment of the present invention, only a reference number for a storage node contact shown in FIG. 7 was changed, remaining others equally.

FIG. 8 and FIGS. 10 through 16 are cross-sectional diagrams illustrating the three-dimensional structure of an exemplary embodiment of the invention along the lines C–C' and D–D' of FIG. 7. FIGS. 17 to 21 illustrate another exemplary embodiment of the invention.

The left side of FIG. 8 and FIGS. 10 to 21 are cross-sectional diagrams illustrating sequential processes along the line C–C' of FIG. 7 (in a word line direction). The right side of FIG. 8 and FIGS. 10 to 21 are cross-sectional diagrams illustrating sequential processes along the line D–D' of FIG. 7 (in a bit line direction).

FIG. 8 illustrates a structure before forming the storage node contact of square type in a DRAM of a capacitor over bit line(COB) structure. A device separation layer 104 is formed on a determined region of a semiconductor substrate 102 to define a plurality of active regions. A gate oxide layer 108a is formed on the active regions. Thereon, a conductive layer 108b and a word line capping layer 108c are sequentially formed. The conductive layer 108b is formed of a polysilicon layer or a metal polycide layer. The word line capping layer 108c is preferably made of a silicon nitride layer. The word line capping layer 108c and the conductive layer 108b are continuously patterned to thus form a plurality of parallel word line stacks 108 traversing the active regions. The word line stack 108 contains the sequentially laminated conductive layer 108b and the word line capping layer 108c. An impurity ion is implanted into the active regions by using the word line stacks 108 and the device separation layer 104 as an ion implantation mask, to thus form impurity regions 106s, 106d. The active impurity regions 106d between one pair of word line stacks 108 traversing each of the active regions are pertinent to a common drain region of the DRAM cell transistor.

Furthermore, the impurity regions 106s formed on both sides of the common drain region 106d are pertinent to a source region of the DRAM cell transistor. A word line spacer 108d is formed on a sidewall of the gate oxide layer 108a and the word line stacks 108 through a conventional method. The word line spacer 108d is preferably formed of the same material layer as the word line capping layer 108c. A first insulation layer 110 is formed on a face of the semiconductor substrate 102 having the word line spacer 108d. The first insulation layer 110 is partially etched to form a bit line pad 114 connected with the common drain region 106d and the storage node contact pad 112 connected with the source region 106s. Then, a second insulation layer 116 is formed on a face of the semiconductor substrate involving the bit line pad 114 and the storage node contact pad 112. The second insulation layer 116 is patterned to form the bit line contact 115 (see FIG. 7). A plurality of bit line stacks 120 connected with the bit line contact 115 are formed. The bit line stacks 120 are formed traversing the word line stacks 108. The bit line stack 120 is formed of a sequentially laminated bit line 120b and a bit line capping layer 120c. Preferably, the bit line 120b can be formed of a conductive layer such as a tungsten layer or a tungsten polycide layer, and the bit line capping layer 120c is formed of a silicon nitride layer. The bit line 120b is electrically connected to the bit line pad 114 through the bit line contact 115(see FIG. 7). A process of forming a bit line spacer (not shown) on a sidewall of the bit line stack 120 may be added. The bit line spacer is formed of the same material as the bit line capping layer 120c.

As shown in FIG. 8, on the semiconductor substrate 102 on which the bit line stack 120 was formed, an upper part of an interlayer insulation layer 118 is flattened so as to be equal to an upper height of the bit line capping layer 120c.

The interlayer insulation layer 118 can be formed through procedures of depositing insulation material on the semiconductor substrate 102 and then flattening it, and is preferably formed with material having a high etching selection rate as compared with the bit line capping layer 120c. Furthermore, the interlayer insulation layer 118 is formed of a silicon oxide layer. The interlayer insulation layer may be formed from a single material layer or from multiple material layers.

With reference to FIG. 9, a line type mask pattern 123 is formed on the semiconductor substrate 102 having the interlayer insulation layer 118.

The line type mask patterns 123 are formed in a direction perpendicular to the bit line stacks 120, and do not contain the line C–C' of FIG. 7. Thus, in FIG. 10 the mask pattern 120 is not shown in a sectional view in the word line direction (left side) and is shown only in a sectional view in the bit line direction (right side).

The mask pattern 123 is preferably formed by selectively using any one of a polysilicon layer, a silicon nitride layer, a material for use of photoresist, or any material having a low etching selection rate as compared with layer material of the interlayer insulation layer 118. The mask pattern 123 may also be formed to a thickness of 100 Å through 5000 Å.

Figure 10:
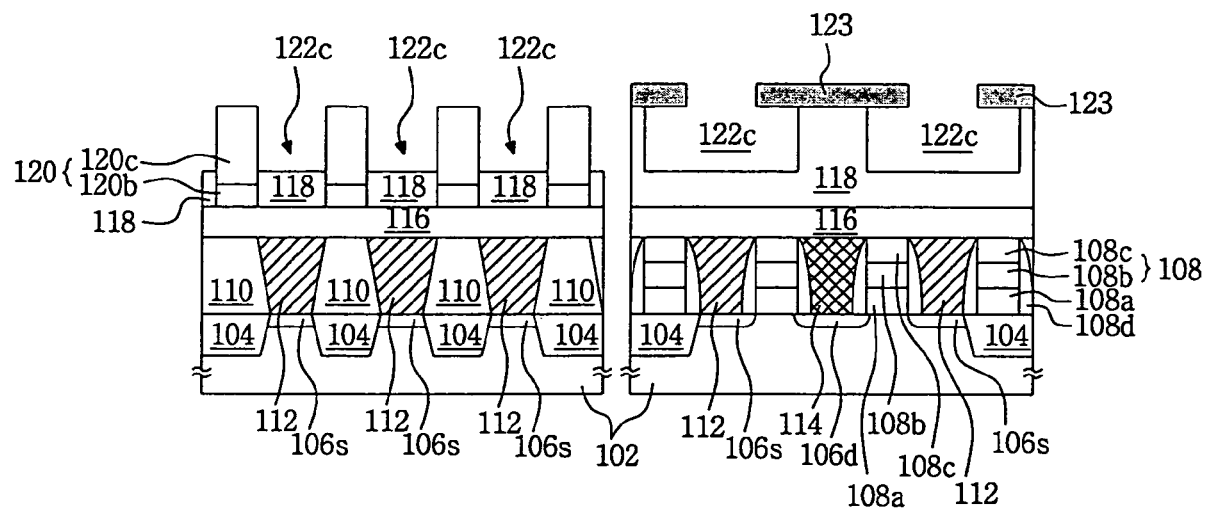

Referring to FIG. 10, using the mask pattern 123, the interlayer insulation layer 118 is isotropically etched to form an opening part 122c.

As shown in FIG. 10, the mask pattern 123 is not shown on the right side of the drawing (bit line direction), but the mask pattern 123 is shown on the left side of the drawing (word line direction). Since the bit line capping layer 120c has a low etching selection rate as compared with the interlayer insulation layer 118, only the interlayer insulation layer 118 is selectively etched to form the opening part 122c even though there is no mask pattern 123.

The opening part 122c is formed extending in a lengthwise direction of the gate, through any one method from among conventional etching methods such as a wet etching, dry etching, and etching using plasma.

The opening part 122c can be formed by anisotropically etching the interlayer insulation layer 118 in a range of 100 Å through 8000 Å through use of the mask pattern 123 and then by isotropically etching its etching portion in a range of 10 Å through 1000 Å.

Figure 11:
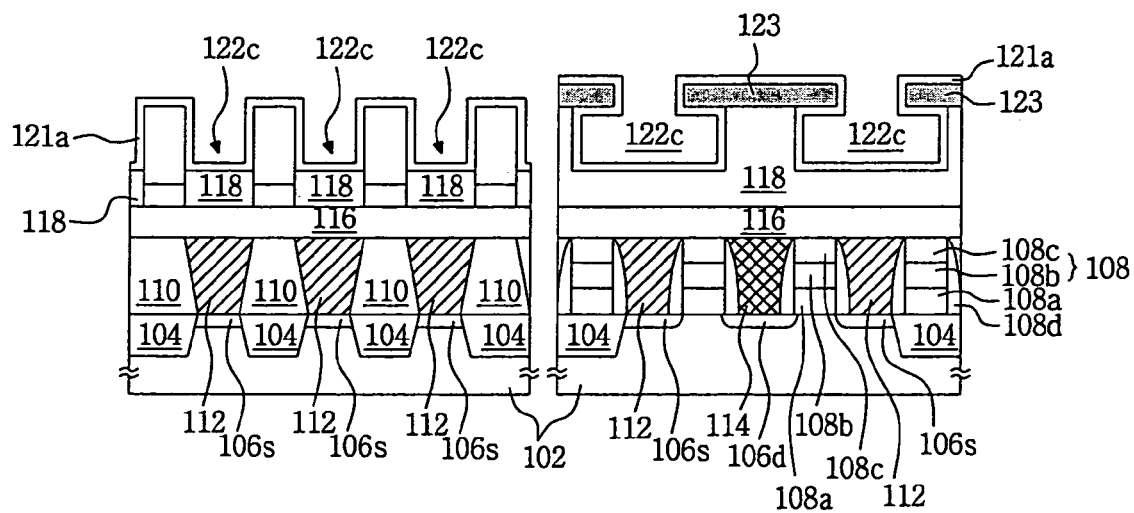

As shown in FIG. 11, a spacer material layer 121a is formed on a face of the semiconductor substrate 102 on which the mask pattern 123 and the opening part 122c were formed.

Thus, the spacer material layer 121a is preferably formed with material having a low etching selection rate as compared with layer material of the interlayer insulation layer 118. For example, the spacer material layer 121a may be formed from a layer selected from a silicon nitride layer, a silicon oxide nitride layer, and a polysilicon layer. A thickness of the spacer material layer 121a is preferably formed in a range of 10 Å through 800 Å.

Figure 12:
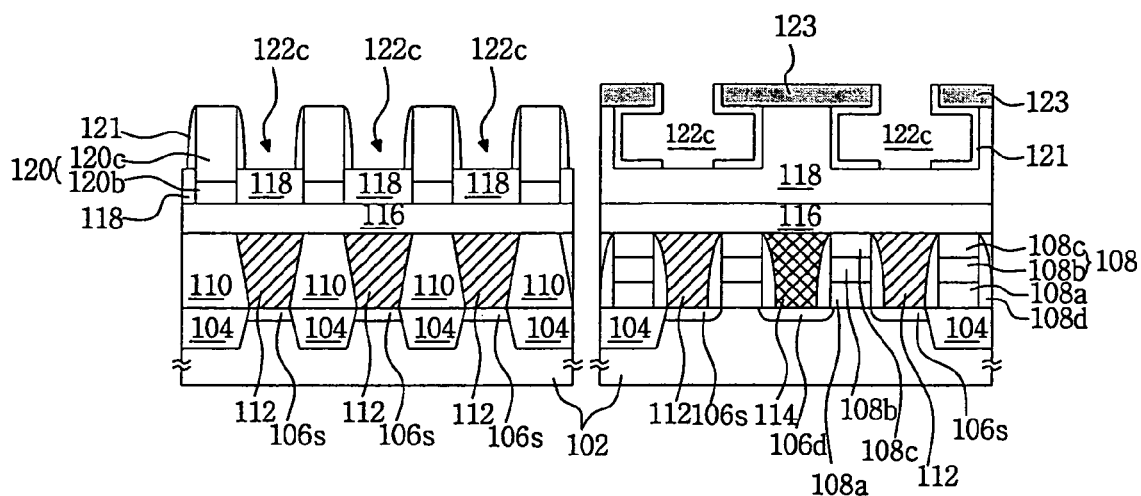

With reference to FIG. 12, a spacer 121 is formed at a sidewall of the mask pattern 123, and is also formed in the interior of the opening part 122c except for the region that overlaps with the storage node contact pad 112.

The spacer 121 is formed by forming the spacer material layer 121a on a face of the semiconductor substrate 102 on which the opening part 122c and the mask pattern 123 were formed, and then, performing an anisotropical etching through which only the spacer material layer 121a that overlaps with the storage contact pad 112 in the lower part of the opening part 122c is removed by using the mask pattern 123. Thus, in the procedure of forming the spacer 121, the bit line spacers are also formed.

Figure 13:
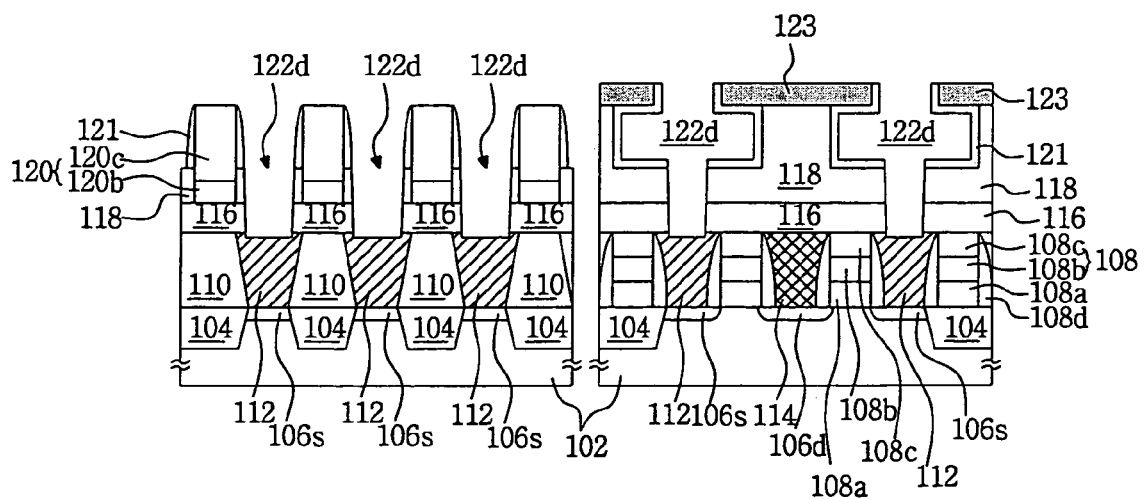

Referring to FIG. 13, a storage node contact hole 122d is formed having a T-shape and connected from an upper part of the opening part 122c to the storage node contact pad 112.

The storage node contract hole 122d is formed by anisotropically etching a portion not having the spacer 121 until the storage node contact pad 112 is exposed.

Figure 14:
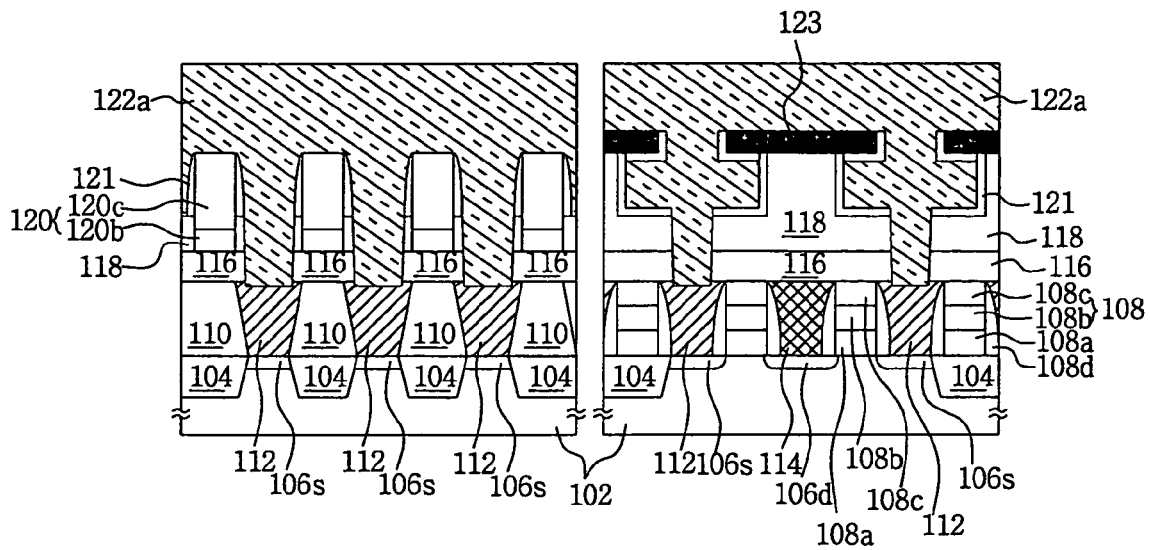

With reference to FIG. 14, a conductive material layer 122a for use as the storage node contact 122 is formed on a face of the semiconductor substrate 102 having the storage node contact hole 122d.

It is preferable to form the conductive material layer 122a with polysilicon material, but other conductive material may also be used.

Figure 15:
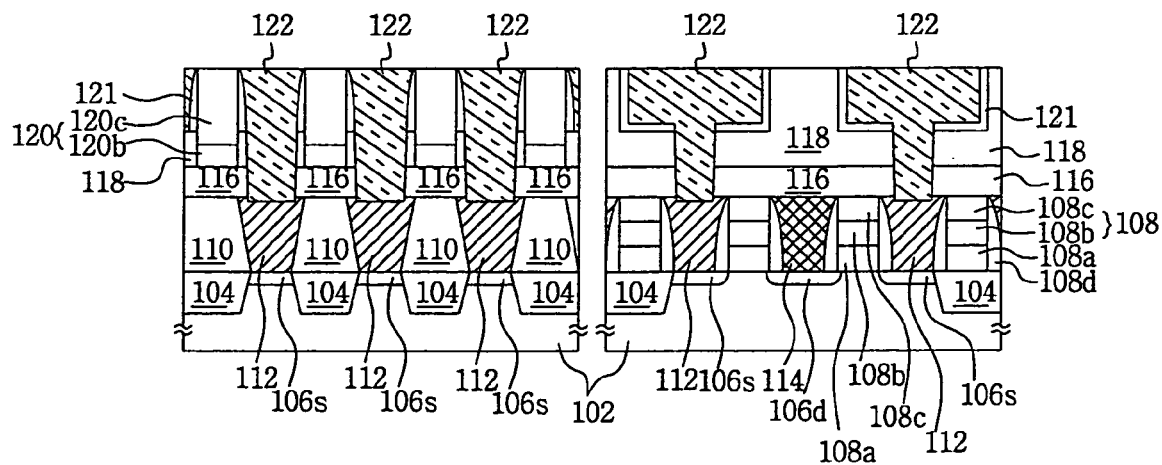
Figure 16:
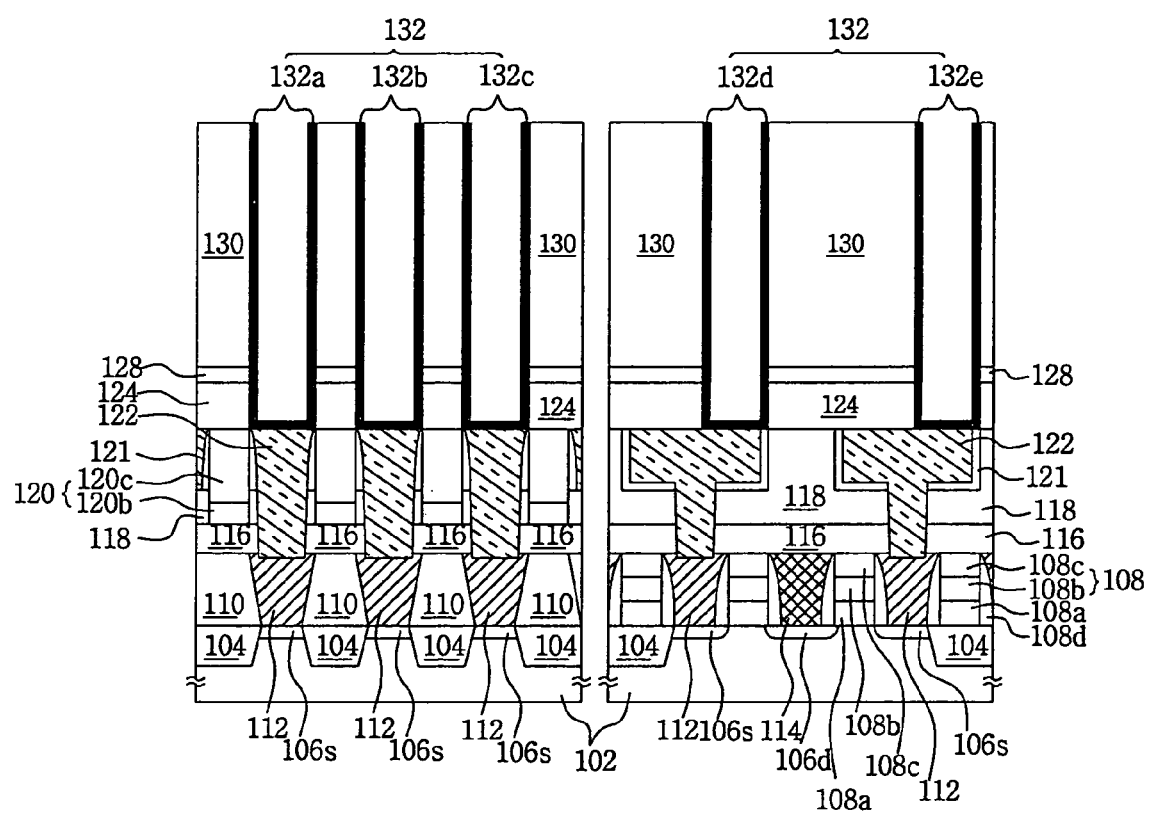
FIG. 16 is a cross-sectional diagram illustrating a square-type storage node contacted with the storage node contact of FIG. 15.

Referring to FIG. 15, the storage node contact 122 is formed after performing a flattening process on the semiconductor substrate 102 having the conductive material layer 122a. The storage node contact 122 is formed in contact with an upper part of the storage node contact pad 112, and an upper region thereof extends in a gate length direction of a cell transistor to form a structure that is larger than a size of a lower region thereof.

The storage node contact 122 is formed by performing the flattening process through use of the bit line capping layer 120c as a flattening stop layer, and the mask pattern 123 is also removed. The flattening process is performed mainly through a chemical and mechanical polishing (CMP) process or through an etch back process.

Next, a storage node contact forming method and structure will be described according to another exemplary embodiment of the invention. In forming the storage node contact in another exemplary embodiment, the processes up to and including forming of the opening part (122c of FIG. 10) are the same as the description given for the above exemplary embodiment, thus a duplicative description will be omitted. A subsequent process after forming the opening part (122c of FIG. 10) will be sequentially described referring to FIGS. 17 through 21.

Figure 17:
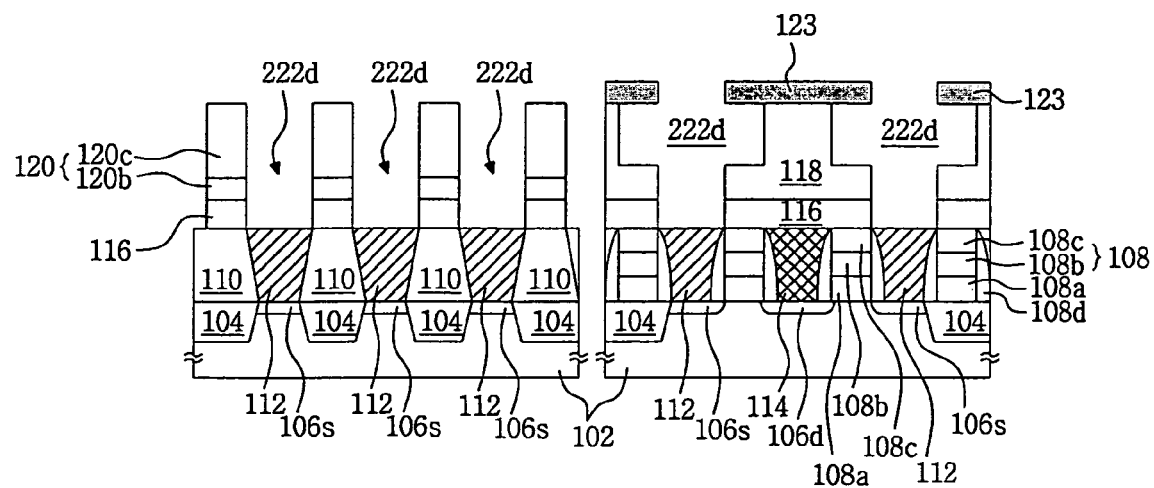
FIGS. 17 through 21 are cross-sectional diagrams illustrating sequential processes in forming a storage node contact according to an exemplary embodiment of the invention.

Referring to FIG. 17, after forming the opening part (122c of FIG. 10), a portion overlapped with the storage node contact pad 112 as a lower portion of the opening part 122c is anisotropically etched so as to expose the storage node contact pad 112 by using the mask pattern 123 as an etch mask. A T-shaped storage node contact hole 222d connected from an upper part of the opening part 122c to the storage node contact pad 112 is formed. This anisotropic etching is performed through a dry etching or an etching method using plasma, etc.

Figure 18:
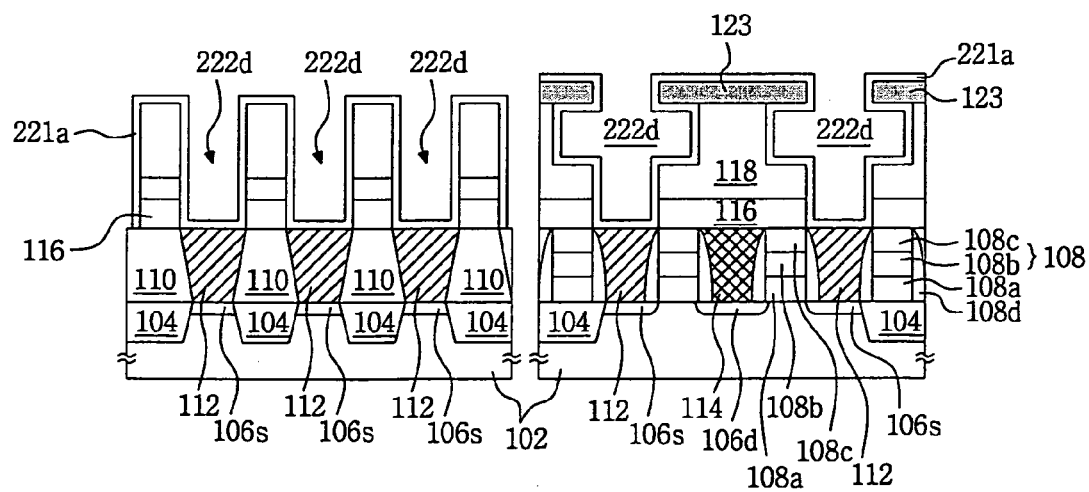

With reference to FIG. 18, a spacer material layer 221a is formed on a face of the semiconductor substrate having the interior of the formed storage node contact hole 222d. The spacer material layer 221a is formed of material having a low etching selection rate as compared with the layer material of the interlayer insulation layer 118. Thus, the spacer material layer 221a can be formed with any one selected material out of a silicon nitride layer, a silicon oxide nitride layer, and a polysilicon layer. A thickness of the spacer material layer 221a can be formed in a range of 10 Å through 800 Å.

Figure 19:
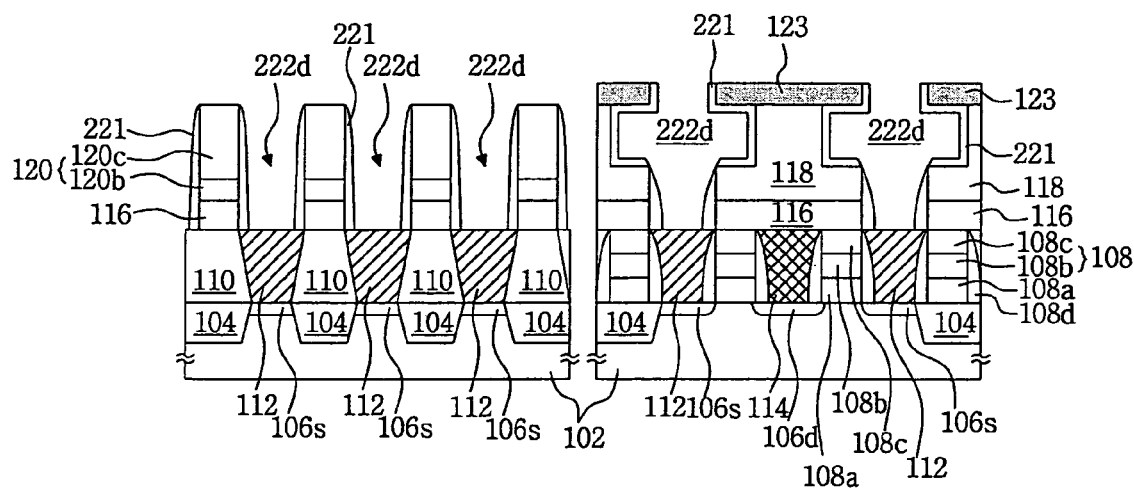

Referring to FIG. 19, a spacer 221 is formed at a sidewall of the storage node contact hole 222d by removing the spacer material layer 221a formed on an upper part of the mask pattern 123 and the exposed storage node contact by using the mask pattern 123 as a mask. The process of removing the spacer material layer 221a is performed through an anisotropic etching process such as a dry etching etc. The overall effect is such that the bit line spacer is formed simultaneously with the spacer 221.

Figure 20:
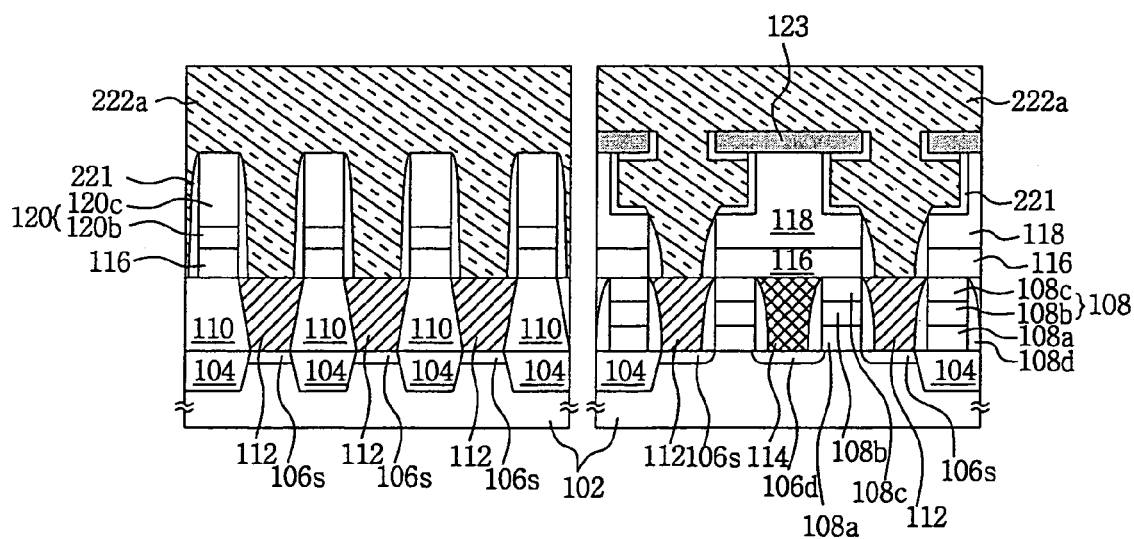

In FIG. 20, a storage node contact conductive material layer 222a is formed on a face of the semiconductor substrate 102 having the storage node contact hole 222d. The conductive material layer 222a can be desirably formed of polysilicon material, or can be formed of other conductive material.

Figure 21:
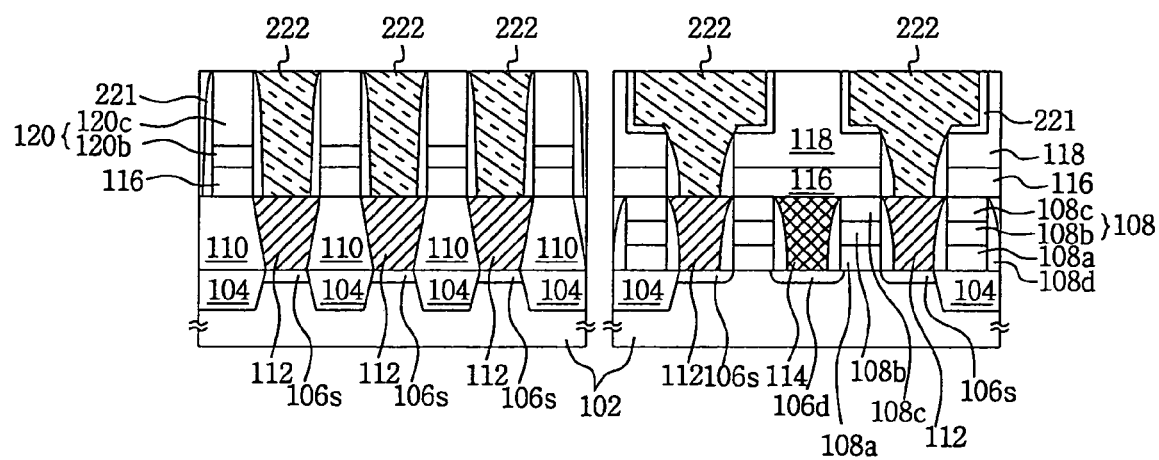

In FIG. 21, a storage node contact 222 is formed through a flattening process such as a CMP process or an etch back process on the semiconductor substrate 102 having the conductive material layer 222a. The flattening process is performed by using the bit line capping layer as a flattening stop layer, and the mask pattern 123 is together removed in this flattening process.

Through the above-described processes, the T-shaped storage node contact 222 electrically connected with the square-type storage node is formed according to another exemplary embodiment of the invention. The storage node contact 222 is formed in contact with an upper part of the storage node contact pad 112, and an upper region thereof is extended in the gate length direction of a cell transistor to form a structure that is larger than a size of a lower region thereof.

In a subsequent process a square-type storage node electrically connected to an upper portion of the storage node contact (122 of FIG. 15, 222 of FIG. 21) may be formed through the exemplary embodiments of the present invention.

FIG. 16 is a cross-sectional diagram illustrating the storage node formed on the storage node contact formed through the subsequent process according to the exemplary embodiment of the invention. In FIG. 16, although the storage node was formed on an upper portion of the storage node contact (122 of FIG. 15) by one exemplary embodiment of the invention, the storage node may also be formed on an upper part of the storage node contact (222 of FIG. 21) by another exemplary embodiment of the invention.

With reference to FIG. 16, in a subsequent process, a storage node 132 is formed on the semiconductor substrate 102 having the storage node contact 122 in such a manner that a lower part of the square-type storage node 132 formed through a buffer layer 124, an etch stop layer 128 and a molding oxide layer 130 is partially contacted with an upper part of the storage node contact 122.

Herewith, contrary to conventional methods, the buffer layer 124 is used to substantially reduce the phenomenon where the structure of the bit line stack 120 and the storage node contact 122 etc. formed under the buffer layer 124 is influenced from a process of etching a portion of the molding oxide layer 130 and from a process of removing a portion of the etching stop layer 128. The buffer layer 124 may be thus formed or may not be formed.

The square type storage node 132 is formed through the sequential processes of forming the etch stop layer 128 and the molding oxide layer 130 on the semiconductor substrate 102 having the storage node contact (122 of FIG. 15, 222 of FIG. 21), and of etching a portion of the molding oxide layer 130 so as to partially overlap with the storage node contact 122 and so that the etch stop layer 128 is exposed, to thus remove the exposed etch stop layer 128 and expose a portion of the storage node contact 122 and then form a portion on which the storage node 132 will be formed. Next, the square-type storage node 132 is formed through filling up the storage node formation portion with a conductive layer and then flattening it. The square-type storage nodes 132a through 132e indicate sectional faces of the square type storage node shown in FIG. 7.

The storage node contact can be widely applied to storage node formation in a semiconductor memory device for use in a DRAM cell. The square type storage node connected to the storage node contact may alternatively be formed a a box type, a cylinder type, and as a hemisphere (HSG) type as a cubic stack structure, or by other several types.

As described above, a storage node contact formed for a connection with a square-type storage node provides at least the following advantages, differently from a contact forming method and structure of the conventional art.

For instance, in the conventional art, a process of forming a contact for a connection with a storage node of square type by using a buffer layer on a storage node contact is required after forming the storage node contact of straight structure. The conventional art, therefore, requires a delicate photolithography process. In the meantime, according to embodiments of the invention, a T-shaped storage node contact extending in a gate length direction is formed and is then connected directly to a storage node, thus it is unnecessary to form a pad contact by using the buffer layer. That is, the delicate photolithography process that is essential for formation of the contact using the buffer layer in the conventional art is unnecessary. In addition, a mask pattern is removed in a flattening process to form a storage node contact, thus a mask pattern removing process is omitted. Therefore, the number of required processes is reduced according to embodiments of the invention.

Also, a lower face of the square type storage node is in contact with an upper portion of a storage node contact, which increases a bottom critical dimension of the storage node. Therefore, a leaning phenomenon is substantially reduced.

Further, a lower part of the storage node has a sufficient contact margin with an upper portion of the T-shaped storage node contact. Therefore, process stabilization is promoted, reducing a manufacturing cost of semiconductor memory and increasing an electrically connected contact area.

There are many ways to practice the invention. What follows are exemplary, non-limiting descriptions of some embodiments of the invention.

According to some embodiments of the invention, a method of forming a storage node contact includes preparing a semiconductor substrate that involves at least one contact pad contacted with an active region of a memory cell transistor through an insulation layer. The method further includes forming a storage node contact having a T-shape, the storage node contact being composed of a lower region contacted with an upper part of the contact pad, and an upper region that is extended to a gate length direction of the memory cell transistor and that is formed as a size larger than a size of the lower region, in order to electrically connect the contact pad with a storage node that is formed in a later process.

According to some embodiments of the invention, a method of forming a T-shape storage node contact includes forming an interlayer insulation layer whose upper height is same as an upper height of a bit line capping layer and whose upper part is flattened, on a semiconductor substrate, and then forming a mask pattern of a line type on an upper part of the capping layer and the interlayer insulation layer vertically to a bit line, wherein the semiconductor substrate at least involves a contact pad contacted with an active region of a memory cell transistor through an insulation layer and has a formation of a bit line having a capping layer. The method includes selectively and isotropically etching a portion of the interlayer insulation layer overlapped with the storage node contact pad by using the mask pattern, to form an opening part extended till a determined portion in a gate direction of the memory cell transistor. The method includes forming a spacer at a sidewall of the mask pattern and within the opening part, excepting of a portion overlapped with the storage node contact pad, and then, partially etching a lower part of the opening part at which the spacer was not formed, by using the spacer and the mask pattern, to thus form a storage node contact hole connected from an upper part of the opening part to an upper part of the storage node contact pad. The method also includes filling up the storage node contact hole with conductive material to form a storage node contact.

According to some embodiments of the invention, a method of forming a T-shape storage node contact includes forming an interlayer insulation layer whose upper height is same as an upper height of a bit line capping layer and whose upper part is flattened, on the semiconductor substrate, and then forming a mask pattern of a line type on an upper part of the capping layer and the interlayer insulation layer vertically to a bit line. The method includes, selectively and isotropically etching, by a determined depth, a portion of the interlayer insulation layer overlapped with the storage node contact pad by using the mask pattern, to form an opening part extended till a determined portion in a gate direction of the memory cell transistor. The method includes anisotropically etching a lower portion of the opening part overlapped with the storage node contact pad by using the mask pattern as an etch mask so as to expose the storage node contact pad and thus form a storage node contact hole connected from an upper part of the opening part to an upper part of the storage node contact. The method also includes forming a spacer at a sidewall of the mask pattern and within the storage node contact hole, excepting of an exposure portion of the storage node contact, and filling up the storage node contact hole having the formation of the spacer, with conductive material, to form a storage node contact.

According to some embodiments of the invention, a bit line spacer can be formed thereto before forming the storage node contact. The embodiments may further include anisotropically etching by a determined depth a portion of the interlayer insulation layer overlapped with the storage node contact by using the mask pattern before isotropically etching the portion of the interlayer insulation layer.

According to some embodiments of the invention, in a structure of storage node contact that is formed, being contacted with a lower part of a storage node constituting a data storage capacitor and being contacted with an upper part of a contact pad, on a semiconductor substrate having at least one contact pad contacted with an active region of a memory cell transistor through an insulation layer, to thus electrically connect the storage node with the contact pad: the structure includes a conductive lower region contacted with an upper part of the contact pad and based on a determined thickness; and a conductive upper region, which is extended to a gate length direction of the memory cell transistor so as to have a size larger than a size of the conductive lower region and which has a thickness gotten by deducting the thickness of the conductive lower region from a contact formation distance from a lower part of the storage node to an upper part of the contact pad, thereby forming an overall T-shaped structure.

The storage node contact formed by the above-described embodiments can function as a contact for connecting between a square type storage node and an active region formed on the semiconductor substrate.

By using embodiments of the invention, a conventional process of forming a pad contact through a buffer layer is omitted, the process margin improves, and the number of overall manufacturing processes is reduced.

It will be apparent to those skilled in the art that modifications and variations can be made to the above embodiments without deviating from the spirit or scope of the invention. For example, the shapes of storage node contact pads and storage nodes or the configuration of layer material may be varied. Likewise, equivalent manufacturing processes may be omitted or added. Thus, it is intended that embodiments of the invention cover any such modifications and variations of this invention provided they come within the scope of the appended claims and their equivalents.

We claim:

1. A method of forming a storage node contact, the method comprising:
preparing a semiconductor substrate that includes at least one storage node contact pad in contact with an active region of a memory cell transistor through an insulation layer;
forming a bit line capping layer and a bit line on an upper part of the semiconductor substrate; and
forming a storage node contact having a lower region and an upper region, a width of the upper region greater than a width of the lower region, a volume of the upper region greater than a volume of the lower region, the lower region in contact with an upper part of the at least one storage node contact pad, the upper region extending in a gate length direction of the memory cell transistor, the storage node contact configured to electrically connect the at least one storage node contact pad wit a storage node, wherein forming the storage node contact includes
forming, on the semiconductor substrate, an interlayer insulation layer having an upper height approximately the same as an upper height of the bit line capping layer and having a flattened upper part, and then forming, vertical to the bit line, a line type mask pattern on an upper part of the bit line capping layer and the interlayer insulation layer,
using the line type mask pattern, selectively and isotropically etching a portion of the interlayer insulation layer overlapped with the storage node contact pad to form an opening part extending in a gate direction of the memory cell transistor,
forming a spacer at a sidewall of the line type mask pattern and within the opening part, except for a portion overlapped with the storage node contact pad, and then, etching a lower portion of the opening part not having the formation of the spacer by using the spacer and the line type mask pattern, thus forming a storage node contact hole connected from an upper part of the opening part to an upper part of the storage node contact pad, and
filling up the storage node contact hole with conductive material to form the storage node contact.

2. The method of claim 1, wherein forming the storage node contact comprises forming an upper portion of the storage node contact to electrically contact a lower part of a square-type storage node.

3. The method of claim 1, wherein forming the line type mask pattern comprises forming the line type mask pattern on an entire face of the semiconductor substrate, excepting a portion where portions overlapped with the storage node contact pad are connected with one another in a word line direction.

4. A method of forming a storage node contact, comprising:
preparing a semiconductor substrate that includes at least one storage node contact pad in contact with an active region of a memory cell transistor through an insulation layer;
forming a bit line capping layer and a bit line on an upper part of the semiconductor substrate; and
forming a storage node contact having a lower region and an upper region, a width of the upper region greater than a width of the lower region, a volume of the upper region greater than a volume of the lower region, the lower region in contact with an upper part of the at least one storage node contact pad, the upper region extending in a gate length direction of the memory cell transistor, the storage node contact configured to electrically connect the at least one storage node contact pad with a storage node, wherein forming the storage node contact includes
forming, on the semiconductor substrate, the interlayer insulation layer having an upper height approximately the same as an upper height of the bit line capping layer and having a flattened upper part, and then forming, vertically to the bit line, a line type mask pattern on an upper part of the bit line capping layer and the interlayer insulation layer, using the line type mask pattern as an etch mask, selectively and isotropically etching, by a determined depth, a portion of the interlayer insulation layer overlapped with the storage node contact pad to form an opening part extending in a gate direction of the memory cell transistor, anisotropically etching a lower portion of the opening part overlapped with the storage node contact pad by using the line type mask pattern as an etch mask so as to expose the storage node contact pad and thus form a storage node contact hole connected from an upper part of the opening part to an upper part of the storage node contact, forming a spacer at a sidewall of the mask pattern and within the storage node contact hole, excepting of an exposure portion of the storage node contact, and filling up the storage node contact hole with conductive material to form the storage node contact.

5. The method of claim 4, wherein forming the storage node contact further comprises forming an upper portion of the storage node contact in electrical contact with a lower part of a square-type storage node.

6. The method of claim 4, wherein forming the line type mask pattern comprises forming the line type mask pattern on a face of the semiconductor substrate, excepting for a portion of the semiconductor substrate where portions of the line type mask pattern overlap with the storage node contact pad and are connected with one another in a word line direction.

7. The method of claim 6, further comprising forming a bit line spacer at a sidewall of a bit line stack before forming the interlayer insulation layer.

8. The method of claim 7, wherein forming the bit line spacer comprises forming the bit line spacer of the same material as the bit line capping layer.

9. The method of claim 6, wherein forming the interlayer insulation layer comprises forming the interlayer insulation layer of a layer material having a higher etching selection rate as compared to the mask pattern and the bit line capping layer.

10. The method of claim 9, wherein forming the interlayer insulation layer further comprises forming the interlayer insulation layer of silicon oxide material.

11. The method of claim 10, wherein forming the line type mask pattern comprises forming the line type mask pattern from a material chosen from the group consisting of polysilicon and silicon nitride.

12. The method of claim 11, wherein forming the line type mask pattern further comprises forming the line type mask pattern to a thickness of about 100 Å to 5000 Å.

13. The method of claim 12, further comprising, before isotropically etching a portion of the interlayer insulation layer, anisotropically etching to a determined depth, by using the line type mask pattern, a portion of the interlayer insulation layer overlapped with the storage node contact.

14. The method of claim 13, wherein anisotropically etching to a predetermined depth a portion of the interlayer insulation layer comprises etching to a depth of about 100 Å to 8000 Å.

15. The method of claim 14, wherein isotropically etching a portion of the interlayer insulation layer comprises etching in a range of about 10 Å to 1000 Å.

16. The method of claim 12, wherein isotropically etching comprises etching with a process selected from the group consisting of wet etching, dry etching, and plasma etching.

17. The method of claim 4, wherein forming the spacer further comprises forming a spacer material layer on an entire face of the semiconductor substrate containing the mask pattern, and then, anisotropically etching the spacer material layer by using the mask pattern as a mask.

18. The method of claim 17, wherein forming the spacer material layer comprises forming a layer material having a lower etching selection rate as compared with the interlayer insulation layer.

19. The method of claim 18, wherein forming the layer material comprises forming a layer selected from the group including a silicon nitride layer, a silicon oxide nitride layer, and a polysilicon layer.

20. The method of claim 4, wherein forming the spacer further comprises forming the spacer to a thickness in a range of 10 Å through 800 Å.

21. The method of claim 4, wherein forming the storage node contact further comprises forming the forming the storage node contact of a polysilicon material.

22. The method of claim 4, wherein forming the storage node contact further comprises:

forming a conductive material layer on a face of the semiconductor substrate so as to fill up the storage node contact hole; and performing a flattening process so as to expose the bit line capping layer.

23. The method of claim 22, wherein performing the flattening process comprises performing a process chosen from the group consisting of a chemical mechanical polishing (CMP) and an etch back process.

24. The method of claim 22, wherein performing the flattening process further comprises simultaneously removing the mask pattern.

* * * * *